(12) United States Patent
Su et al.

(10) Patent No.: US 7,575,778 B2
(45) Date of Patent: Aug. 18, 2009

(54) METHOD OF APPLYING A POLYMER THICK-FILM RESISTIVE PASTE FOR MAKING POLYMER THICK-FILM RESISTOR HAVING IMPROVED TOLERANCES

(75) Inventors: Te-Yeu Su, Taoyuan (TW); Hsin-Herng Wang, Hsinchu (TW); Ying-Ti Chu, Taoyuan (TW); Chin-Ming Chu, Taipei (TW); Li-Chung Ping, Taipei (TW)

(73) Assignee: Embed Technology Co., Ltd., Lujhu Township, Taoyuan County (TW)

( * ) Notice: Subject to any disclaimer, the term of this patent is extended or adjusted under 35 U.S.C. 154(b) by 178 days.

(21) Appl. No.: 10/913,869

(22) Filed: Aug. 7, 2004

(65) Prior Publication Data
US 2005/0051360 A1    Mar. 10, 2005

Related U.S. Application Data

(60) Provisional application No. 60/501,045, filed on Sep. 8, 2003.

(51) Int. Cl.
*B05D 5/12* (2006.01)
*B05D 3/12* (2006.01)
(52) U.S. Cl. .................. 427/101; 427/97.7; 427/356
(58) Field of Classification Search ............ 427/97.7, 427/356, 101
See application file for complete search history.

(56) References Cited

U.S. PATENT DOCUMENTS

| 5,027,703 | A  | * | 7/1991  | Hancy ..................... 101/123 |
| 5,685,221 | A  | * | 11/1997 | Newman .................. 101/123 |
| 5,826,516 | A  | * | 10/1998 | Shimazu et al. ............ 101/483 |
| 6,030,553 | A  | * | 2/2000  | Huang et al. ............. 252/520.3 |
| 6,237,490 | B1 | * | 5/2001  | Takahashi et al. .......... 101/129 |
| 6,335,055 | B1 | * | 1/2002  | Miyahara et al. ........... 427/272 |
| 6,923,117 | B1 | * | 8/2005  | Onishi et al. ............. 101/123 |

FOREIGN PATENT DOCUMENTS

JP          08-282080      * 10/1996
JP          09-239955      * 9/1997

* cited by examiner

*Primary Examiner*—Brian K Talbot
(74) *Attorney, Agent, or Firm*—Amad Tayebi

(57) ABSTRACT

The present invention teaches formulations, apparatus and a method of applying high thixotropic index polymer thick-film resistive pastes for making polymer thick-film resistors with improved tolerances by providing a squeegee with a blade tilted at an angle of 10° to 85° to the surface of the printed circuit board thus causing a fluid rotational motion within the bead of the polymer thick-film resistive paste as the squeegee blade moves relative to the printed circuit board. This rotational motion increases the shear strain rate experienced by the paste within the bead and results in a more effective filling of the resistor-shaped cavity without including air bubbles, experiencing elastic recovery of the paste and, without surface fractures of the paste.

4 Claims, 1 Drawing Sheet

METHOD OF APPLYING A POLYMER THICK-FILM RESISTIVE PASTE FOR MAKING POLYMER THICK-FILM RESISTOR HAVING IMPROVED TOLERANCES

This application claims priority of a Provisional Patent Application (Ser. No. 60/501,045) filed on Sep. 8, 2003.

FIELD OF THE INVENTION

The present invention is in the field of polymer thick-film resistors and methods and apparatus for manufacture of same. In particular, this invention relates to a method of applying or depositing polymer thick-film resistive paste on a printed circuit board and making printed circuit board resistors with improved tolerances. In addition, this invention relates to a simple apparatus for application of polymer thick-film resistive paste and to novel curable polymer thick-film resistive pastes for making resistors with improved tolerances.

BACKGROUND OF THE INVENTION

The prior art teaches a variety of formulations and methods for making polymer thick-film resistors. Examples of such prior art are disclosed in U.S. Pat. Nos. 4,021,277, 4,368,252, 4,540,463, 4,865,873, 4,870,746, 5,039,570, 5,994,997, 6,108,212, 6,130,601, 6,171,921, 6,194,990, 6,225,035, 6,229,098, 6,232,042 and 6,256,866, each of which is incorporated, by reference, in its entirety in this application.

Some of the drawbacks of the prior art methods, formulations and resistors are i) the wide ranges of variability of the resistance of the cured resistors, thus the wide ranges of variability of current flowing through the resistors and consequently lower reliability of circuit performance, ii) the substantial printed resistor dimensional changes during the curing process and iii) the high percentage of volatile solvents contained in the ink and paste formulations of the prior art.

The present invention overcomes the drawbacks of the prior art by providing novel polymer thick-film resistive paste formulations which have lower percentages of volatiles. It also overcomes the problems associated with dimensional changes by providing pastes with high thixotropic index, a novel apparatus for application of polymer-thick film resistive pastes and a novel method of applying polymer thick-film resistive pastes which increases the shear strain rate in the paste bead prior to its transfer to the cavity where the resistor is to be formed.

BRIEF DESCRIPTION OF THE INVENTION

The curable polymer thick-film resistive paste of the present invention has a high thixotropic index and contains a low percentage, by weight, of non-reactive solvent. Therefore, upon printing or depositing the paste, in the form of a resistor on a printed circuit board, the printed paste retains its shape and dimensions, even when subjected to the effects of gravity. As such, the uncured shape and dimensions of the resistor are retained through the curing process and the resulting cured resistor has a very low resistance variability (less than +/−10%).

In addition, because of its extremely high solid content, by weight, and its low non-reactive solvent content, of less than 10% by weight, the paste of the present invention experiences very low/insignificant dimensional and/or shape changes during the curing process since the percentage of evaporating volatiles/solvents contained in the paste is low. An example of non-reactive volatile solvents that may be used is MEK (Methyl Ethyl Ketone).

The present invention also teaches a method of applying polymer thick-film resistive pastes for making polymer thick-film resistors with improved tolerances by providing a squeegee with a blade tilted at an angle of 10° to 85° to the surface of the printed circuit board thus causing a fluid rotational motion within the bead of the polymer thick-film resistive paste as the squeegee blade moves relative to the printed circuit board. This rotational motion increases the shear strain rate experienced by the paste within the bead and results in a more effective filling of the resistor-shaped cavity without including air bubbles, experiencing elastic recovery of the paste and, without surface fractures of the paste.

DETAILED DESCRIPTION OF THE INVENTION

Figure 1:
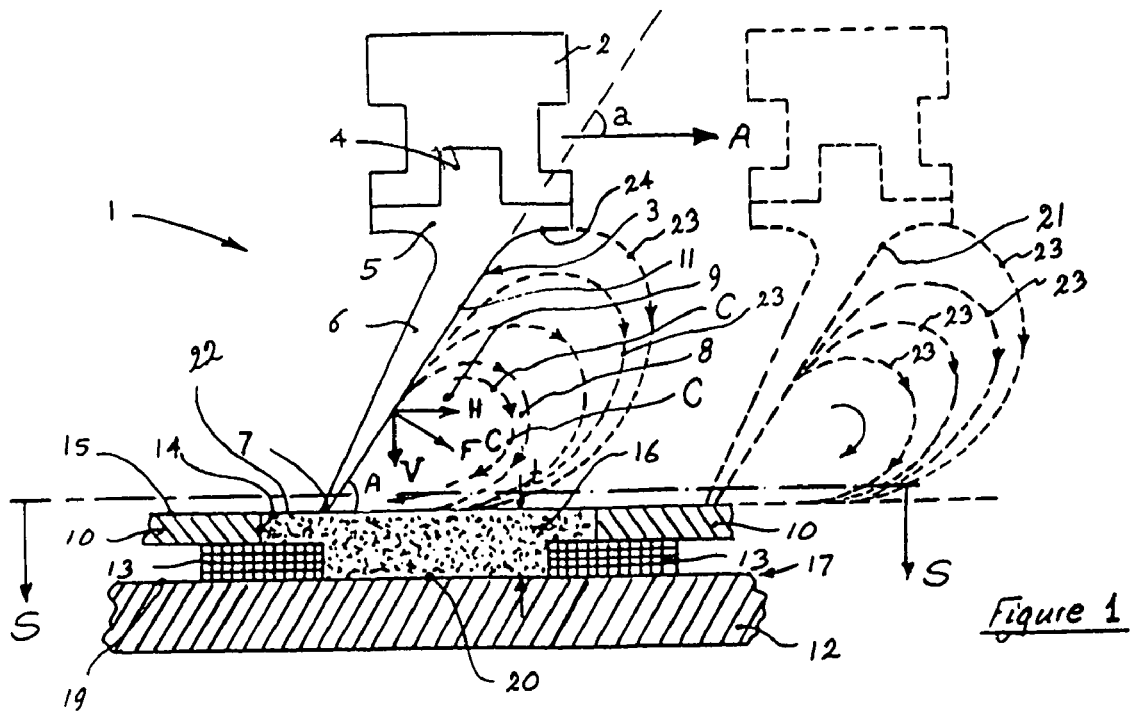
FIG. 1 is a side view of polymer thick-film resistive paste printing apparatus.

FIG. 1 shows an embodiment of a printing apparatus 1 for applying/depositing a polymer thick-film resistive paste on a dielectric, i.e., a non-conductive layer and forming a polymer thick-film resistor connecting conductive terminals, in accordance with the present invention. As shown therein, a tool holder 2 is provided for holding a specially-shaped squeegee 3. Squeegee 3 comprises a tool holder connection part 4, an upper section 5, a blade 6 which ends with a blade tip 7. Blade 6 and blade tip 7 may be made of any material, including rubber, plastic material or metals, provided the contact area at the bottom of blade tip 7 is smooth and planar. In accordance with the present invention, front surface 11 of blade 6 is oriented at an angle A to the direction of travel of tool holder 2, indicated by arrow A. Direction of arrow A is substantially parallel to the top surface 15 of a stencil sheet or a screen sheet 10 and tip blade 7 presses downwardly and travels in direction A while maintaining contact with top surface 15. In accordance with the present invention, angle A is in the range of 10° to 85° degrees. Angle A, being less than 90 degrees, generates a reaction force F between thixotropic paste bead 8 and front surface 11, which is perpendicular to surface 11. Force F has a downward component V and a horizontal component H. Downward force component V pushes the thixotropic fluid in bead 8 downwardly towards top surface 15 and thus causes a fluid rotational motion within bead 8, as indicated by arrows C and flow lines 23 in FIG. 1. In accordance with the present invention, and as shown in FIG. 1, the upper portion 24 of front surface 11 is gradually curved downwardly towards top surface 15 in order to gradually direct flow lines 23 towards top surface 15. Therefore, the thixotropic fluid/paste within bead 8 is caused to flow along recirculating flow lines 23 without accumulating on the surface of the squeegee and without dripping on top surface 15. Fluid rotational motion within bead 8 results in an increase in the shear strain rate to which the thixotropic fluid of bead 8 is subjected. In accordance with the present invention, the thixotropic index TI of thixotropic paste 9 is at least 3 and preferably in the range of 3 to 10. Therefore, as a result of the combination of the high thixotropic index of paste 9, the fluid rotational motion within bead 8 and the increase of shear strain rate experienced by thixotropic paste 9, the apparent viscosity of the fluid of bead 8 decreases significantly and the thixotropic paste fills cavity 16 more readily, effectively, substantially without including air bubbles and without experiencing any significant elastic recovery effects and/or surface fractures which are usually exhibited by high viscosity pastes when subjected to high surface shear strain rates.

For the purpose of this invention, the apparent viscosity at a particular shear strain rate is the ratio of the shear stress experienced by the fluid to the particular shear strain rate applied on the fluid. Also, in accordance with the present invention, the thixotropic index TI is defined as the ratio of apparent viscosities measured at 1 RPM and at 10 RPM, using a Brookfield viscometer, and conducted in accordance with the Standard Test Method described in ASTM Designation D 1824-87, published by the American Society for Testing and Materials. Test method D 1824-87 is familiar to those skilled in the art.

In accordance with the present invention and as shown in FIG. 1, cavity 16 is defined by a bottom surface 20, which is a portion of upper surface 19 of dielectric board or layer 12 which is the non-conductive substrate of printed circuit board 17. Surface 20 extends between electrically conductive or connecting terminals 13 which are located on surface 19 and are formed or deposited by a variety of methods known to those skilled in the art. Cavity 16 is also defined by top opening 22 which is coplanar with top surface 15 of stencil sheet or screen sheet 10. Top opening 22 has a perimeter 18 which is defined by a cutout made in the stencil sheet or by a mesh opening made in the screen sheet. Surface 15 and opening 20 define thickness t of the desired polymer thick-film resistor, joining conductive terminals 13, which is obtained upon the low-shrinkage curing of the polymer thick-film paste deposited in cavity 16. Thickness t may be determined or controlled by selecting the thickness of terminals 13 and thickness of stencil sheet or screen sheet 10. In a typical application, in accordance with the present invention, thickness t was controlled to 18 microns, +/−0.9 micron (i.e., +/−5%). The perimeter 18 of cavity 16 is defined by a cutout or a mesh opening 14 in stencil sheet or screen sheet 10.

Figure 2:
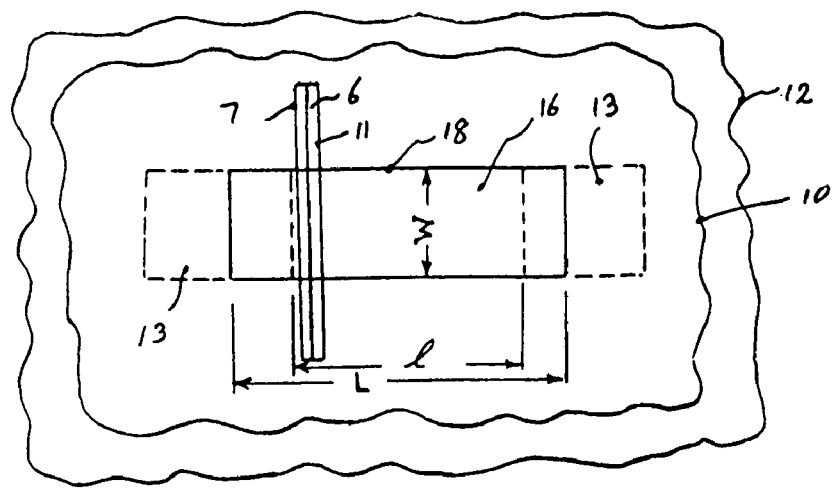
FIG. 2 is a top view of cross-section S-S.

FIG. 2 is a top view of cross-section S-S. As shown therein, cutout or mesh opening 14 has a rectangular perimeter 18 which has a length L and a width W. Alternatively, cutout or mesh opening perimeter 18 may be shaped in any other shape and dimensions. The distance 1 between terminals 13, width W and thickness t, in combination with the material resistance of cured polymer thick-film paste determine the final resistance of the obtained polymer thick-film resistor.

As shown in FIG. 1, squeegee 3, having been moved beyond the perimeter 18 of cavity 16, is represented by broken lines 21. At this point, the high thixotropic index paste, prepared in accordance with the present invention and deposited in cavity 16, recovers to a high viscosity low-shrinkage paste which does not significantly become recessed below the plane defined by top surface 15 of stencil sheet 10 nor change its shape or dimensions even under the influence of gravitational forces. As a result, it has been possible to obtain polymer thick-film resistors with improved tolerance (less than +/−10% of the resistors resistance).

Thus, in accordance with the present invention, a method of applying a polymer thick-film resistive paste for making polymer thick-film resistors having improved tolerances, comprises the following steps: 1) providing a squeegee having a blade with a front surface oriented at an angle A to the direction of travel of a tool holder holding the squeegee. Angle A is in the range of 10° to 85°, 2) providing a polymer thick-film resistive paste having a thixotropic index at least equal to 3, 3) placing a bead of the paste in front of the front surface of the squeegee blade, 4) providing a cavity which is defined by i) a bottom surface which is a portion of the upper surface of a non-conductive substrate of a printed circuit board. The bottom surface includes electrically conductive terminals, ii) a top opening which is coplanar with the top surface of a stencil sheet or a screen sheet placed on top of the upper surface of the non-conductive substrate. The top opening has a perimeter which is defined by a cutout made in the stencil sheet or a mesh opening made in the screen sheet, and iii) a thickness or depth t which is determined by the thickness of the conductive terminals and the thickness of the stencil sheet or the thickness of the screen sheet, and 5) moving the squeegee, while maintaining contact between the tip of the squeegee blade and the top surface of the stencil sheet or the screen sheet and pressing the tip of the blade downwardly against the stencil sheet or the screen sheet, in a direction substantially parallel to the top surface of the stencil sheet or the screen sheet and the top opening, thereby a) causing a fluid rotational motion within the paste bead, b) increasing the shear strain rate experienced by the paste within the bead, c) decreasing the apparent viscosity of the paste and d) filling the cavity with the paste without including air bubbles, experiencing elastic recovery of the paste and, without surface fractures of the paste.

The above-described method may further comprise the step of curing the paste placed in the cavity. The curing step may be carried out at a temperature in the range of 120° C. to 230° C.

Alternatively, the curing step of the paste placed in the cavity may comprise the steps of pre-curing the paste at a temperature in the range of 120° C. to 160° C. and post-curing the paste at a temperature in the range of 160° C. to 230° C.

The above-described method may also comprise the step of direct post-curing the paste at a temperature in the range of 160° C. to 230° C.

Examples of prior art resistive inks suitable for screen printing and their respective viscosities, thixotropic index values, resistance and tolerance data are presented in Table 1.

TABLE 1

|  | Sample Identification | |
|---|---|---|
|  | A | B |
| Manufacturer | 1 | 2 |
| Viscosity (cps) | Approx. 40,000 | 50,000–70,000 |
| Thixotropic Index (dimensionless) | Approx. 2 | Approx. 2 |
| Sheet Resistance on Catalogue (Ohm/Square) | 10 | 1,000 |
| Average Sheet Resistance (Ohm/Square) | 12.8 | 1109 |
| Tolerance (%) | +/−45 | +/−30 |
| Curing Profile |  |  |
| Drying | 80° C., 10 min | — |
| Curing | 200° C., 30 min | 170° C., 60 min |

Examples of experimental trials of polymer thick-film resistive paste compositions, prepared, thoroughly mixed and applied in accordance with the present invention, and their respective data are presented in Tables 2, 3, 4 and 5.

TABLE 2

| [Trial I] | |
|---|---|
| Ingredient | Parts |
| ERL-4221E*[1] | 114 |
| Adeka Optomer CP-66*[2] | 1.5 |
| Graphite Powder, $D_{50}$ = 5:m*[3] | 10 |

TABLE 2-continued

[Trial I]

| Ingredient | Parts |
|---|---|
| Printex ® XE-2*[4] | 1.6 |
| Disperbyk 164*[5] | 8 |

*[1]Cycloaliphatic Epoxy by Dow Chemical
*[2]Catalyst by Asahi Denka
*[3]CHINA ACTIVATED CARBON INDUSTRIES LTD.
*[4]Conductive Carbon Black by Degussa AG
*[5]Disperse agent by BYK-Chemie

TABLE 3

[Trial II]

| Ingredient | Parts |
|---|---|
| ERL-4221E | 114 |
| Adeka Optomer CP-66 | 1.5 |
| Graphite Powder, $D_{50}$ = 5:m | 10 |
| Printex ® XE-2 | 1.6 |
| Disperbyk 164 | 8 |
| CAB-O-SIL TS-720 *1 | 5 |

*1 Fumed Silica by Cabot Corp.

TABLE 4

[Trial III]

| Ingredient | Parts |
|---|---|
| ERL-4221E | 114 |
| Adeka Optomer CP-66 | 1.5 |
| Graphite Powder, $D_{50}$ = 5:m | 10 |
| Printex ® XE-2 | 1.6 |
| Disperbyk 164 | 8 |
| Silver Powder EG2351 *1 | 23 |
| CAB-O-SIL TS-720 | 2 |

*1 By Johnson Matthey plc.

TABLE 5

[Data of Trials I, II and III]

| | Trial Number | | |
|---|---|---|---|
| | I | II | III |
| Viscosity (c. poise)* | 180,000 | 210,000 | 460,000 |
| Thixotropic Index | 5.11 | 6.9 | 8.2 |
| Average Sheet Resistance (Ohm/Square) | 1,000 | 100 | 18 |
| Tolerance (%) | +/−6.9 | +/−8.1 | +/−7.9 |
| Curing Profile | | | |
| Pre-cure | 140° C. | 140° C. | 140° C. |
| Post-cure | 180° C. | 180° C. | 180° C. |

*Measured in accordance with ASTM D-1824,5 at 2 RPM using Brookfield viscometer, Model HAT, HA # 7, Spindle # 7

Alternatively, in accordance with the present invention and the above described method, the flow behavior of the paste used for making polymer thick-film resistors may be a Bingham fluid type. As it is known to those skilled in the art, a Bingham fluid flow behavior is one in which no flow occurs until the shear stress exceeds a critical level called the yield stress, above which the shear stress is proportional to the shear strain rate. As such, when squeegee 3 has been moved beyond the perimeter 18 of cavity 16, the Bingham fluid type paste, selected in accordance with the present invention, recovers to a Bingham plastic state, i.e., a state in which no flow, change of shape or dimensions occur until a shear stress, at least equal to the yield stress, is applied to the paste. As a result, it is also possible to obtain polymer thick-film resistors with very low tolerances of the resistors resistance. Examples of epoxy resin pastes, exhibiting Bingham fluid behavior, which may be selected for use as curable base epoxies in accordance with the present invention, are DEVCON brand Plastic Steel and Titanium Putty produced by Illinois Tool Works Company of Danvers, Mass., USA. Other similar Bingham fluid type epoxies may be obtained from other epoxy manufacturers.

As described above, in accordance with the present invention, the apparatus for application of a polymer thick-film resistive paste for making polymer thick-film resistors having improved tolerances, comprises: a) a squeegee having a blade with a tip and a front surface. The front surface is oriented at an angle A to the direction of travel of a tool holder holding the squeegee, b) a stencil sheet or a screen sheet which may be adapted to be placed onto the upper surface of a non-conductive substrate of a printed circuit board and having at least one cutout made in the stencil sheet or at least one mesh opening made in the screen sheet. The cutout and the mesh opening are suitably shaped to include two unconnected electrically conductive terminals, c) a means for placing a bead of a polymer thick-film resistive paste in front of the front surface of the blade, d) a means for pressing the tip of the blade downwardly against the top surface of the stencil sheet or the screen sheet and maintaining contact between the tip of the blade and the top surface of the stencil sheet or the screen sheet, and e) a means for moving the tool holder in a direction substantially parallel to the top surface of the stencil sheet or the screen sheet.

It should be noted that when the selected paste is of a thixotropic behavior, angle A is preferably in the range of 10° to 85°.

In accordance with the present invention, the electrical conductivity, the thixotropic index and the yield stress of the thixotropic curable epoxy paste or Bingham fluid type curable epoxy paste may be modified by adding certain behavior-modifying agents. For example, conductive particles such as graphite powder, conductive carbon black, carbon nano-spheres, carbon nano-tubes, metal powders such as silver powder, gold powder, copper powder, nickel powder, silver coated glass powder, and metal flakes such as silver flakes may be added to the curable epoxy to enhance the electrical conductivity of the cured epoxy or to adjust it to the desired level. Also, titanium dioxide, silver powder and silica dust may be added to the curable epoxy in order to increase its thixotropic index or to increase its yield stress. Certain agents may also serve a dual purpose, for example, the addition of graphite powder to the curable epoxy increases its thixotropic index and simultaneously decreases its electrical resistance, i.e., renders it more electrically conductive.

The prior art provides information relating to polymer thick-film resistive pastes and inks, but does not teach the novel combinations and teachings disclosed in this application including the polymer thick-film curable epoxy compositions, the method of selecting and applying the polymer thick-film resistive paste and the apparatus described in this application.

In accordance with the present invention, a curable polymer thick-film resistive paste for making polymer thick-film resistors having improved resistance tolerances, comprises: an epoxy resin, with a weight in the range of 30 to 90%, a catalyst, with a weight in the range of 0.1 to 10%, conductive particles, with a weight in the range of 0 to 70%, and a dispersing agent such as Disperbyk 164 available from BYK-Chemie, with a weight in the range of 0.1 to 10%. The epoxy resin may be in the form of a single component or in the form of two reactive components. The curable polymer thick-film resistive paste, formulated, made and applied in accordance with the present invention, may be cured, in the desired form, dimensions and shape of a resistor, by heating or by exposing, to ultraviolet light rays, the printed circuit board on which the resistive paste is applied or deposited. The cured resistor, thus obtained, has a low tolerance (+/−10%), and the printed circuit board, thus obtained, has a higher circuit performance reliability due to the low tolerances (+/−10%) of the resistors thus made and deposited or embedded in it in accordance with the present invention.

Examples of epoxy resins used in making the polymer thick-film resistive pastes of the present invention are Bisphenol type, Cycloaliphatic type and Novalac type epoxy resins. Examples of curing agents or catalysts used in making the polymer thick-film resistive pastes of the present invention are anhydride, triaryl sulfonium hexafluorophosphate salts, and onium salts including iodonium, Ferrocenium salts, and cumene hydroperoxide as a co-initiator oxidizing ferrocenium salt to yield stronger Lewis salt.

The curable paste may also comprise thixotropic behavior-adjusting additives, with a weight of up to 50%, such as silica powder, fumed silica, nano clay, inorganic particles known in the art to yield high gelling effect, polyester-amide co-polymers, organo clays and their mixtures.

The invention claimed is:

1. A method of applying a polymer thick-film resistive paste for making polymer thick-film resistors having improved tolerances, comprising the steps of;

providing a squeegee, said squeegee having a blade with a front surface oriented at an angle A to the direction of travel of a tool holder holding said squeegee, said angle A being in the range of 10° to 85°, providing a polymer thick-film resistive paste, said paste having a thixotropic index at least equal to 3, and comprising; thixotropic behavior adjusting additives, selected from the group consisting of silica powder, fumed silica, nano clay, polyester-amide co-polymers and organo clays, a non-reactive solvent, said non-reactive solvent being Methyl Ethyl Ketone, an epoxy resin, with a weight in the range of 30 to 90%, a catalyst, with a weight in the range of 0.1 to 10%, conductive particles, selected from the group consisting of graphite powder, conductive carbon black, carbon nano-spheres, carbon nano-tubes, metal powders, silver-coated glass powder and metal flakes, and, a dispersing agent, with a weight in the range of 0.1 to 10%, placing a bead of said paste in front of said front surface, providing a cavity, said cavity being defined by i) a bottom surface, said bottom surface being a portion of the upper surface of a non-conductive substrate of a printed circuit board, said bottom surface including electrically conductive terminals, ii) a top opening, said top opening being coplanar with the top surface of one of a stencil sheet and a screen sheet placed on top of said upper surface of said non-conductive substrate, said top opening having a perimeter, said perimeter being defined by one of a cutout made in said stencil sheet and a mesh opening made in said screen sheet, and iii) a thickness or depth t, said thickness being determined by the thickness of said conductive terminals and the thickness of said one of a stencil sheet and a screen sheet, and moving said squeegee, while maintaining contact between the tip of said blade and the top surface of said one of a stencil sheet and a screen sheet and pressing said tip downwardly against said one of a stencil sheet and a screen sheet, in a direction substantially parallel to said top surface of said one of a stencil sheet and a screen sheet and said top opening, thereby a) causing a fluid rotational motion within said bead, b) increasing the shear strain rate experienced by said paste within said bead, c) decreasing the apparent viscosity of said paste and d) filling said cavity with said paste without including air bubbles, experiencing elastic recovery of said paste and, without surface fractures of said paste.

2. The method of claim 1 further comprising the step of curing said paste in said cavity.

3. The method of claim 1 further comprising the step of curing said paste in said cavity at a temperature in the range of 120° C. to 230° C.

4. The method of claim 3 wherein said step of curing said paste in said cavity comprises the steps of pre-curing said paste at a temperature in the range of 120° C. to 160° C. and post-curing said paste at a temperature in the range of 160° C. to 230° C.

* * * * *